United States Patent
Muramatsu et al.

[11] Patent Number: 5,229,922
[45] Date of Patent: Jul. 20, 1993

[54] ELECTRICAL JUNCTION BOX WITH STACKED INSULATING PLATES AND BUS-BARS WITH STEPPED TABS

[75] Inventors: Yukio Muramatsu; Mamoru Araki; Keiichi Ozaki, all of Kosai, Japan

[73] Assignee: Yazaki Corporation, Japan

[21] Appl. No.: 765,938

[22] Filed: Sep. 26, 1991

[51] Int. Cl.⁵ .................. H05K 7/06; H05K 7/14; H01R 9/09
[52] U.S. Cl. ................................ 361/395; 361/399; 439/76
[58] Field of Search ................ 439/34, 76, 74; 361/395, 399, 413, 414, 415

[56] References Cited

U.S. PATENT DOCUMENTS

| | | | |
|---|---|---|---|
| 4,255,004 | 3/1981 | Kourimsky et al. | 439/76 X |
| 4,603,930 | 8/1986 | Ito | 439/76 X |
| 4,685,753 | 8/1987 | Isshiki et al. | 439/76 X |
| 4,689,718 | 8/1987 | Maue et al. | 439/76 X |
| 4,781,600 | 11/1988 | Sugiyama et al. | 439/74 X |
| 4,781,621 | 11/1988 | Sugiyama et al. | 439/76 X |
| 4,811,168 | 3/1989 | Chesnut et al. | 439/76 X |
| 4,850,884 | 7/1989 | Sawai et al. | 439/76 |
| 4,906,195 | 3/1990 | Kubota et al. | 439/76 |
| 4,909,745 | 3/1990 | Hayashi | 439/76 |
| 4,950,168 | 8/1990 | Watanabe et al. | 439/34 |
| 4,963,099 | 10/1990 | Sato et al. | 439/34 X |
| 5,023,752 | 6/1991 | Detter et al. | 361/399 |
| 5,057,026 | 10/1991 | Sawai et al. | 439/76 |
| 5,097,592 | 3/1992 | Shutz, Jr. et al. | 439/34 X |

FOREIGN PATENT DOCUMENTS 54-168585 11/1979 Japan.

Primary Examiner—Leo P. Picard
Assistant Examiner—Michael W. Phillips
Attorney, Agent, or Firm—Venable, Baetjer and Howard

[57] ABSTRACT

An electrical junction box is constituted by accommodating bus-bar circuit board composed of a plurality of bus-bars and an insulating plate in a case member composed of upper, lower and side cases. The bus-bar has a terminal for a connector vertically erecting from the surface of the bus-bar and introduced into fastening portions of the upper and lower cases and a terminal extending in parallel to the surface of the bus-bar while keeping a level difference so as to be accommodated in the housing of the side case at a predetermined pitch. In order to easily align the terminals and easily assemble and fasten a predetermined terminal or a connector, a boss and a cut portion are formed to correspond to the insulating plate for the purpose of supporting the terminal. As an alternative to this, a support member is inserted between the insulating plates.

10 Claims, 11 Drawing Sheets

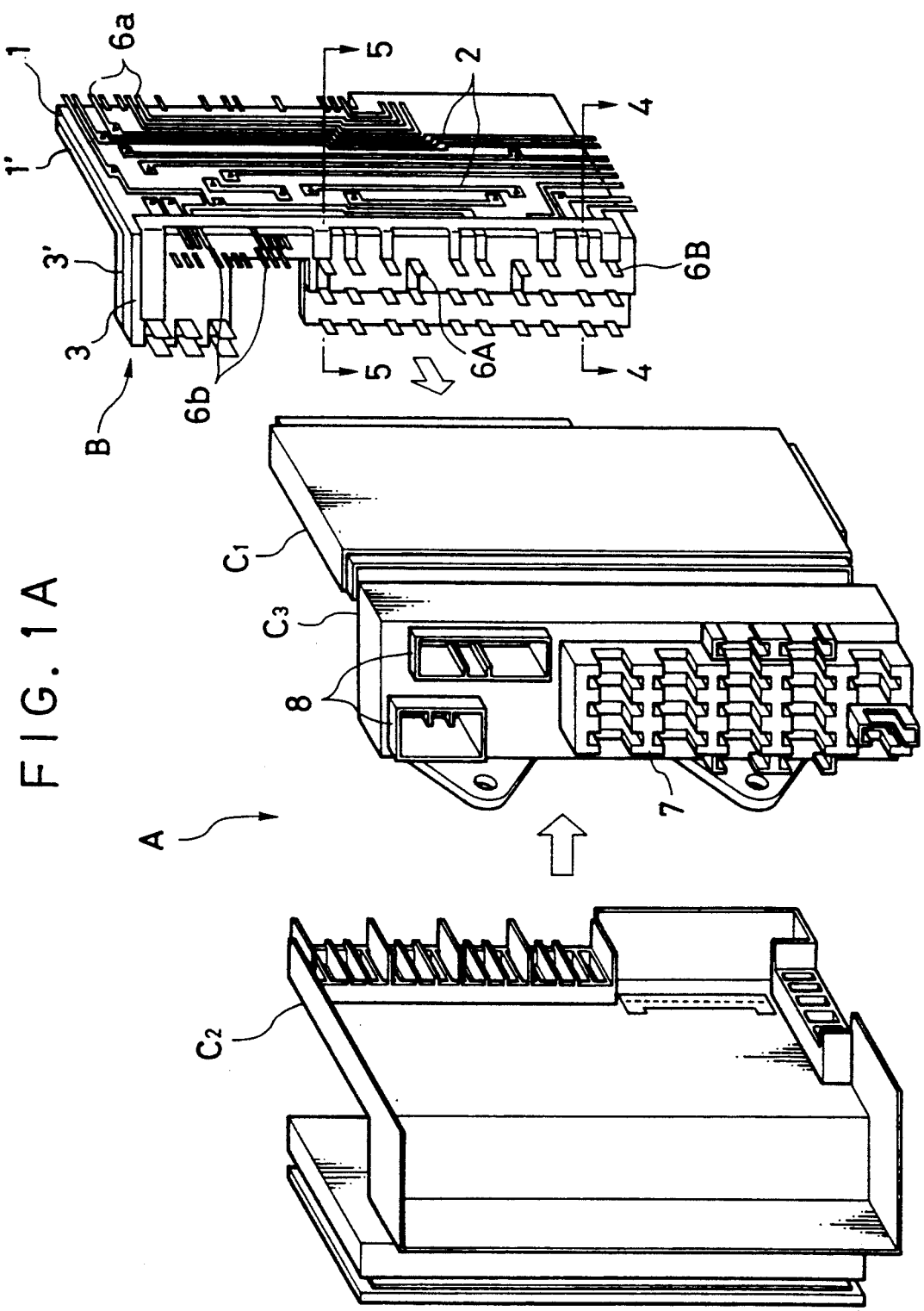

F I G. 9
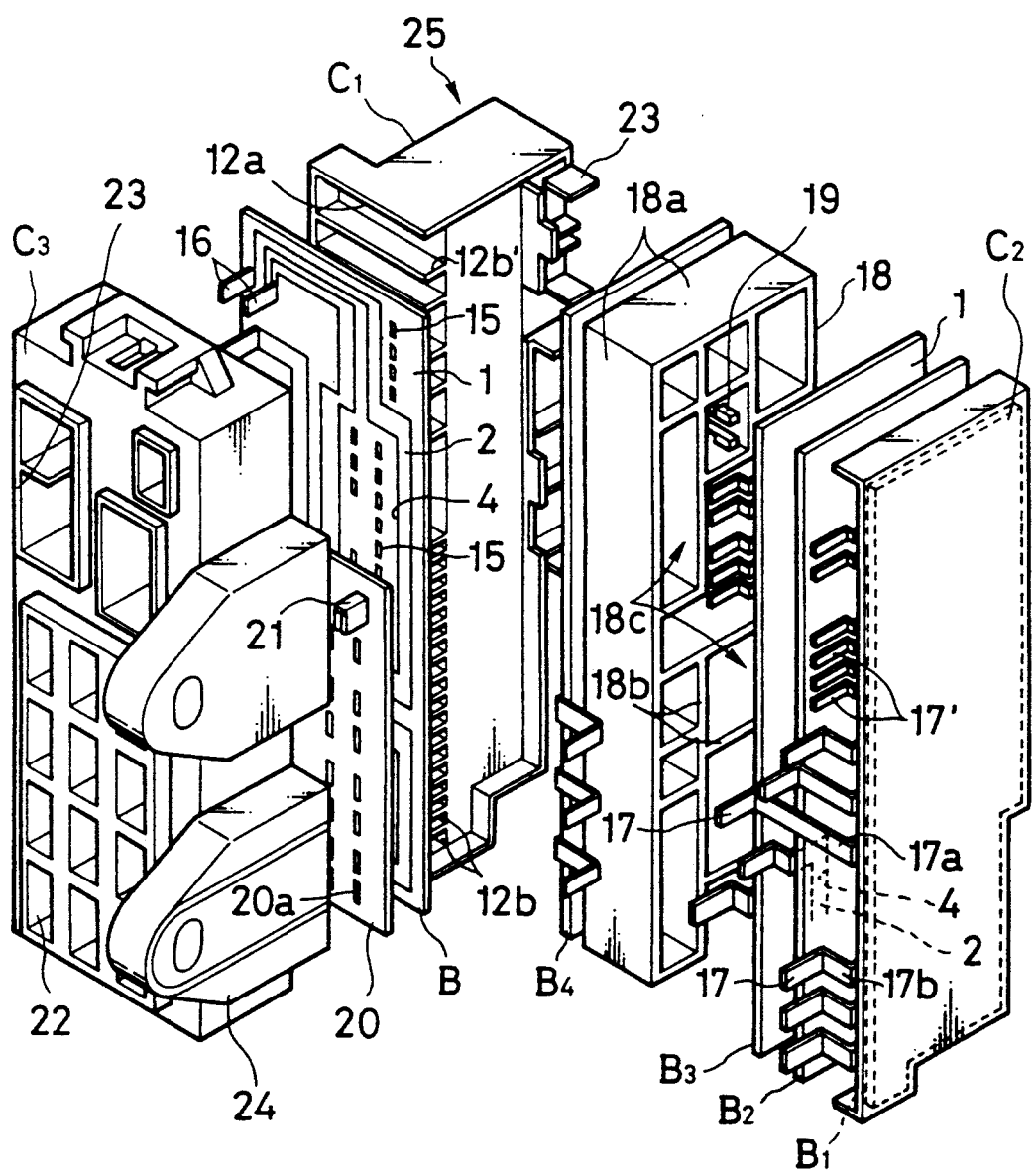

ELECTRICAL JUNCTION BOX WITH STACKED INSULATING PLATES AND BUS-BARS WITH STEPPED TABS

BACKGROUND OF THE INVENTION

1. Field of the Invention

The present invention relates to an electrical junction box for use, for example, in establishing a relative connection between electric circuits in the form of a wire harness.

2. Related Art Statement

An electrical junction box is typically constructed constituted in such a manner that a plurality of circuit boards are stacked together and accommodated in a case, and connectors connectors are disposed on both the upper surface and the lower surface of the aforementioned case so as to be connected to the internal circuits. However, the number of the connectors formed on the two surfaces of the case is insufficient where an increase in the number of internal circuits is required. Such an increase is due to a considerable increase in the number of electric units needed for an automobile and because of the mounting of an electronic unit that includes the control circuits for controlling the above-described electric units. Therefore, electrical junction boxes each having connectors formed on a side surface thereof, that is, electrical junction boxes arranged in such a manner that connectors can also be fastened to the side surfaces have been used widely in recent years.

A bus-bar circuit board which serves as the internal circuit of the electrical junction box is typically constructed by stacking a plurality of bus-bars, which have desired patterns, and insulating plates. Successively formed on the bus-bars are tabs that project upward or downward. The bus-bars are, as the connector terminal, respectively introduced into connector fastening portions of the upper and the lower cases.

In order to raise the density of the projecting tabs, i.e., increase the number of tabs and improve the efficiency of disposing the bus-bars, a structure has been employed (refer to Japanese Patent Laid-Open No. 54-168585) in which a parallel tab extending in parallel to the surface of the bus-bar and projecting over an edge of the insulating plate is fastened to a connector housing disposed on the side surface of the case. The parallel tab may be either a plane tab extending from the bus-bar directly or a stepped tab which is cranked at the end surface of the insulating plate. In this case, an alignment of the pitch of a group composed of the parallel tabs to the terminals of the connectors, to which the group is fastened, can be accomplished by changing the height established due to the bending of tabs.

However, the stepped (cranked) tab projecting over the insulating plate encounters the following various problems due to its structure:

(1) Since two portions of the stepped tab must be bent, it is difficult to accomplish an alignment at the front end portion of the tab.

(2) As a result, a predetermined terminal or a connector cannot easily be fastened, therefore requiring additional time to be taken in order to complete the assembling operation.

(3) Since the cranked portion is formed at the end surface of the stacked insulating plate, that is, at the same height and in the same plane, only the bus-bars disposed in the same layer can be subjected to the bending work. Therefore, the tabs cannot freely be projected out.

(4) The developed length of the bus-bar becomes too long and the area of the bus-bar formed by pressing work becomes too large. Furthermore, yield or number of the bus-bars that can be punched out from a thin plate deteriorates.

(5) Structures for projecting and supporting the stepped tabs become too complicated. In addition, a desired circuit of the above-described type cannot easily be designed. Therefore, an excessively large cost is required to manufacture the punching die and the molding die. In addition, the assembling facility is unsatisfactory.

An object of the present invention is therefore to provide an electrical junction box capable of overcoming the above-described problems and structured in such a manner that connectors can also be fastened to the side surface thereof.

SUMMARY OF THE INVENTION

Accordingly, an object of the present invention is to provide an electrical junction box structured so as to enable a proper alignment of stepped tabs, which are, crank so that, fastening of predetermined terminals or connectors can easily be performed.

Another object of the present invention is to provide an electrical junction box in which stepped tabs can be projecting from each layer of the insulating plates, the density of the stepped tabs can be raised and an efficiency of disposing the bus-bars can be improved.

Another object of the present invention is to provide an electrical junction box in which the number of stepped tabs directly extending from a bus-bar can be reduced so that the length of the developed bus-bar can be shortened and the yield or number of punched bus-bars can be improved.

Another object of the present invention is to provide an electrical junction box in which the density of or number bus-bars of the uppermost or the lowermost insulating plate can substantially be raised.

Another object of the present invention is to provide an electrical junction box wherein the shape of a bus-bar and that of an insulating plate is simplified so that the ease of assembling is improved and the manufacturing cost is reduced.

According to one aspect of the present invention, there is provided an electrical junction box comprising: a case member composed of an upper case, a lower case and a side case having a housing; a circuit board accommodated between the upper case and the lower case and formed by stacking a plurality of bus-bars and an insulating plate for supporting the bus-bars; a plurality of terminals for connectors extending from a desired bus-bar of the circuit board in parallel to the surface of a plate of the circuit board yet at a different level than the surface, a plurality of the terminals for connectors being disposed at a predetermined pitch in the housing; and means for supporting the terminals for connectors in such a manner that an alignment of the terminals can easily be accomplished and assembling and fastening of a predetermined terminal or a connector can easily be performed.

According to an aspect of the present invention, each of a plurality of the connector terminals comprises a stepped tab, having a first bent portion projecting over the edge and cranked to form a root and a second bent portion defining the height or number of punched bus-bars and the means for supporting the terminal for connector has a boss projecting over the edge of one of two insulating plates and a cut portion is formed in the edge of the other insulating plate to correspond to the boss.

Since the cranked portion of the stepped tab is held by the boss and the other insulating plate or the case, alignment of the stepped tab can be accomplished. Therefore, assembling and fastening of a predetermined terminal or a connector can easily be performed.

When the stepped tab is constructed in such a manner that it is formed by shifting the bending position of the first bent portion of the cranked portion in each layer of the insulating plate and by changing the position of the second bent portion, the stepped tab can be formed from a bus-bar of a desired layer. Therefore, the bus-bar can be satisfactorily freely designed. In addition, since the number of the stepped tabs which can be projected can be increased, the efficiency of disposing the bus-bar can substantially be improved.

According to an aspect of the present invention, each of a plurality of the connector terminals has a tab projecting upwards or downwards from the surface of the plate of the desired bus-bar, a plane tab extending on the plane of the desired bus-bar, and a relay terminal having, in at least an end portion thereof, a female terminal portion which corresponds to the plane tab and formed into a U-shape cross sectional shape or a crank shape and that is connected to the plane tab so that a stepped tab corresponding to the plane tab is formed.

Another structure may be employed in which a relay terminal having, in at least an end portion thereof, a female terminal portion which corresponds to the projected tab and is formed into an L-shape cross sectional shape. The relay terminal is connected to the projected tab so that a stepped tab corresponding to the plane tab is formed.

According to this aspect, the necessity of directly forming a stepped tab having a cranked portion in the bus-bar disposed on the insulating plate can be eliminated. Therefore, the bus-bar can satisfactorily and freely be disposed and yield or number of the bus-bars punched out from a from a thin plate can be improved. Therefore, the pattern of disposing the bus-bar can be simplified.

According to an aspect of the present invention, a wide bus-bar accommodating groove is formed in an upper opening periphery portion of a bus-bar accommodating groove formed in the uppermost or lowermost insulating plate whereby a structure is provided in which bus-bar can be disposed in two stages or levels vertically spaced apart.

Width the wide bus-bar accommodating groove, another bus-bar can be formed above the ordinary bus-bar. Therefore, the density of the bus-bars can be raised.

According to an aspect of the present invention, a frame-shape spacer having a frame surface, which is wider than the pitch of the terminal for the connector, is interposed in a desired layer of the circuit board so that the stepped tab is supported by the frame surface.

A terminal for connecting desired bus-bars disposed in the bus-bar circuit board or between the bus-bar circuit boards is accommodated in the opening portion of the frame-shaped spacer.

According to this embodiment, the electrical junction box is arranged in such a manner that the frame-shape spacer having the frame surface which is wider than the pitch of the terminals for the connectors is disposed in, for example, an intermediate layer of the circuit board. As a result, the terminal for a connector having the step can be supported by utilizing the above-described frame surface. Therefore, the structure of the insulating plate can be simplified as well as the structure of the bus-bar (the circuit pattern) can be simplified. Since another effect of improving the assembling facility is obtained, the manufacturing cost can be significantly reduced. In addition, the terminal for connecting the bus-bar circuit board layers or the bus-bars in the same layer can be accommodated by utilizing the opening portion in the frame-shape spacer. Therefore, the pattern of the bus-bar can further be simplified. Consequently, a desired circuit can easily be designed.

Other and further objects, features and advantages of the invention will be appear more fully from the following description.

BRIEF DESCRIPTION OF THE DRAWINGS

FIG. 1A is an exploded perspective view which illustrates an embodiment of an electrical junction box according to the present invention which comprises a bus-bar circuit board and an insulating case for accommodating it;

FIG. 9 is a perspective view which illustrates another embodiment of the electrical junction box according to the present invention;

DETAILED DESCRIPTION OF THE PREFERRED EMBODIMENTS

Figure 1B:
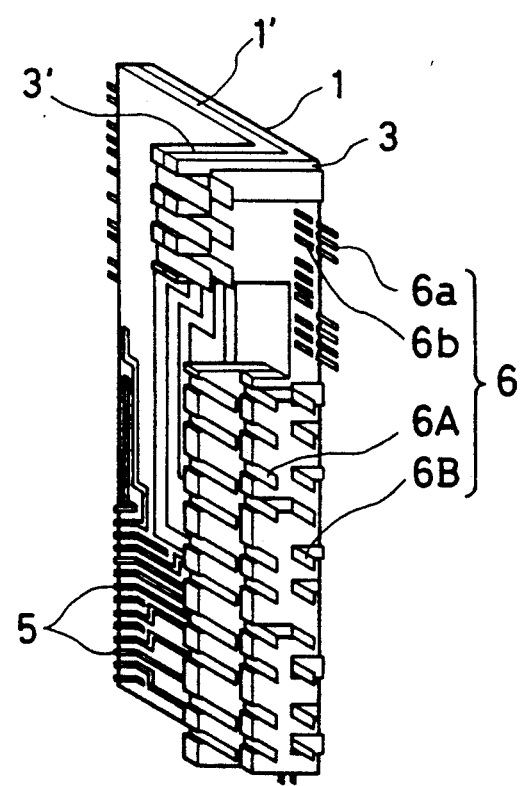
FIG. 1B is a perspective view of the bus-bar circuit board shown in FIG. 1A as viewed from the rear side.

Referring to FIGS. 1A and 1B, an electrical junction box A comprises a bus-bar circuit board B accommodated in a space between an upper case $C_1$ and a lower case $C_2$. The electrical junction box further comprises a side case $C_3$. The side case $C_3$ has a multiplicity of housings, such as fuse cavities 7, connector connecting portions 8 and the like that provide structure in which connectors can be disposed on the side surfaces.

The bus-bar circuit board B comprises two insulating plates 1 and 1' and plurality of bus-bars 2 disposed on an upper surface thereof, on lower surfaces thereof and on intermediate portions of the two insulating plates 1 and 1'. The insulating plates include respective side plates 3 and 3' that are vertically disposed.

Figure 2:
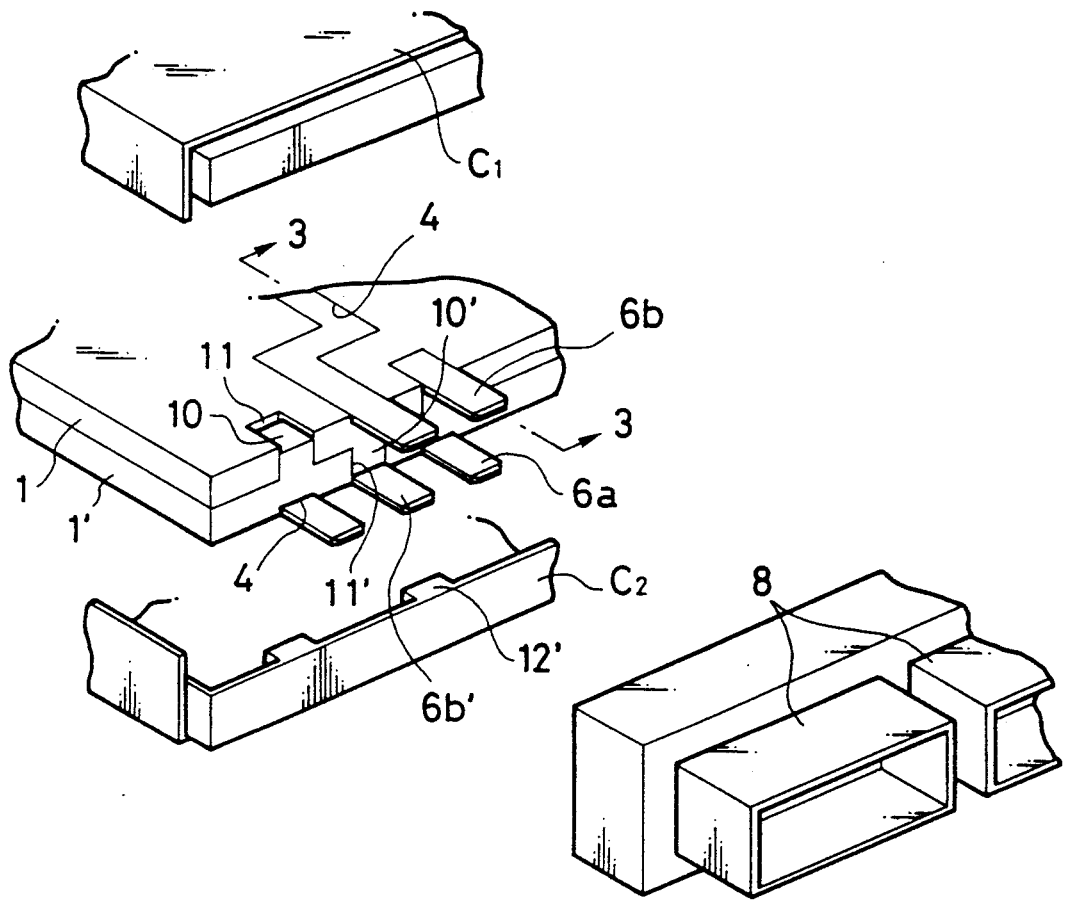
FIG. 2 is an enlarged exploded view which illustrates an essential portion of the bus-bar circuit board shown in FIG. 1A.
Figure 3:
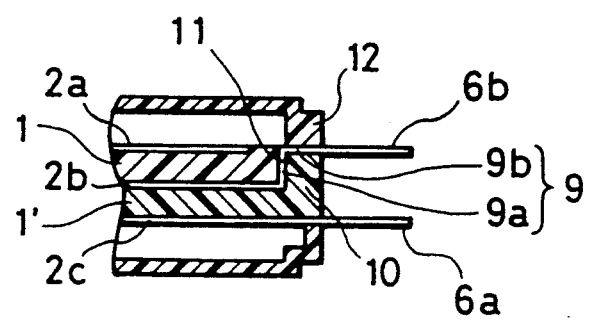
FIG. 3 is a cross section view taken along line 3—3 of FIG. 2 illustrating the bus-bar circuit board in an assembled state.

As shown in FIGS. 2 and 3, each of the insulating plates 1 and 1' has a plurality of bus-bar accommodating grooves 4 on its two sides or either side so that the bus-bars 2 can be placed and disposed within the above-described grooves 4. In accordance with bus-bars 2 comprise circuit structure, the bus-bar 4 comprises tab-shaped terminals (hereinafter called "tabs") 5 for connectors. The tabs 5 project from the plate surface as shown in FIG. 1B. The bus-bars 2 further comprise parallel tabs 6 projecting from the side edges of the insulating plates 1 and 1'. The parallel tabs 6 include plane tabs 6A and 6a that project from the surface of the bus-bar plate and stepped tabs 6B and 6b. According to this embodiment each of the tabs 6A and 6B has a large width, while each of the tabs 6a and 6b has a narrow width.

The wide plane tab 6A and the stepped tab 6B are formed to serve as terminals for a fuse (or terminals for a large electric current). The wide tabs 6A and 6B are supported by the above-described side plates 3 and 3' in such a manner that they are accommodated in the housing formed by the side case $C_3$ while being arranged at a predetermined pitch. The narrow plane tab 6a and the stepped tab 6b serve as ordinary connector terminal are formed in such a manner that they are accommodated in the connector connecting portion 8 of each of the cases $C_1$ and $C_3$ similarly to the projecting tabs 5.

FIG. 2 is an enlarged, exploded and perspective view which illustrates an essential portion of FIG. 1A. FIG. 3 illustrates a cross sectional view illustrating the bus-bar circuit board in an associated state.

Referring to FIGS. 2 and 3, a bus-bar 2b disposed at the intermediate portion between the upper and the lower insulating plates 1 and 1' has a steeped tab 6b which is formed from a cranked portion 9. A projecting boss 10 is formed at the side edge of the lower insulating plate 1' to correspond to the above-described cranked portion 9. Furthermore, a cut portion 11 into which the boss 10 can substantially be fit is formed in the upper insulating plate 1. In an assembled state, the components of the bus-bar circuit board B are arranged in stacked layers, the root portion 9a of the cranked portion 9, that is, a first ben portion 9a is held and secured between the cut portion 11 and the boss 10, while a second bent portion 9b is held and secured between the boss 10 and a boss retainer 12 of the upper case $C_1$. Similarly, a stepped tab 6b' is formed from the bus-bar 2b in the intermediate layer along a downward cranked portion (omitted from illustration). The stepped tab is held and secured so that is projects over the upper insulating plate 1, a cut portion 11' formed in the lower insulating plate 1' and a boss retainer 12' of the lower case $C_2$. Referring to FIGS. 2 and 3, reference numerals 2a and 2c respectively represent the bus-bar in the uppermost layer and that in the lowermost layer. The plane tab 6a formed from the bus-bar 2c is held and secured by the lower insulating plate 1' and the lower case $C_2$.

According to this embodiment, the stepped tab 6b (6b') is formed in the intermediate bus-bar 2b in such a manner that the root portion 9a of its cranked portion 9 is held and secured by the boss 10 (10') of the insulating plate 1' (1) and the upper cover $C_1$ (the lower cover $C_2$). Therefore, an alignment to a group composed of the plane tabs 6a can easily be achieved. As a result, the assembling or fastening of a predetermined terminal or a connector can easily be performed. Furthermore, the presence of the cranked portion 9 establishes the pitches between the upper and lower plane tabs 6a and the stepped tabs 6b (6b').

Figure 4:
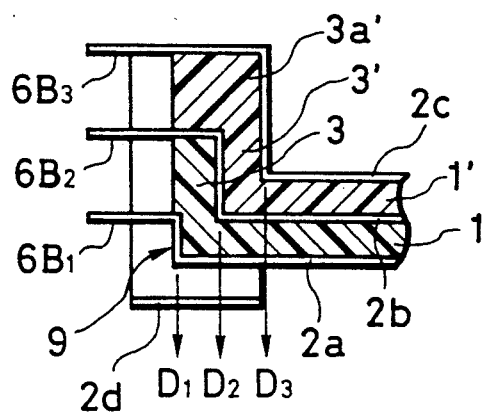
FIG. 4 is a cross sectional view taken along line 4—4 of FIG. 1A.
Figure 5:
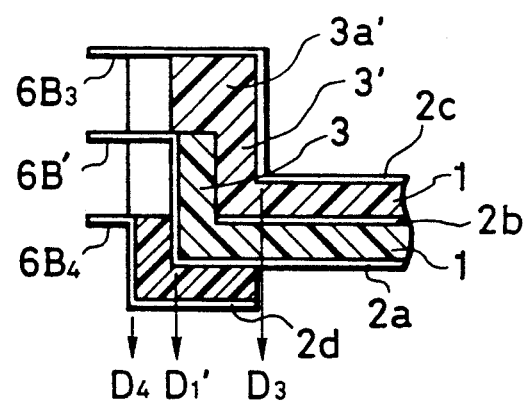
FIG. 5 is a cross sectional view taken along line 5—5 of FIG. 1A.
Figure 6A:
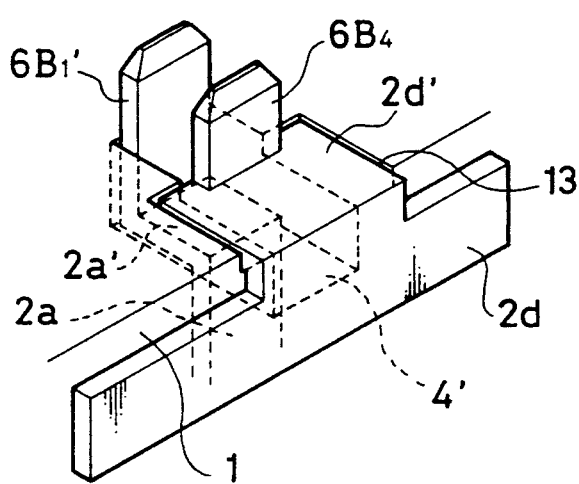
FIG 6A to 6D are respectively a perspective view, a plan view,, a vertical cross sectional side elevational view and a vertical cross sectional front elevational view which illustrate the stepped tabs $6B_1'$ and $6B_4$ shown in FIG. 5.
Figure 6B:
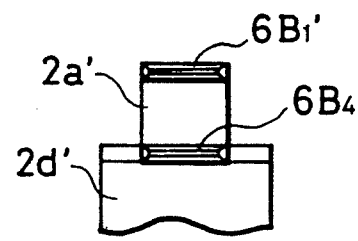
Figure 6C:
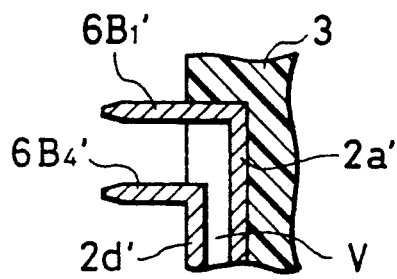
Figure 6D:
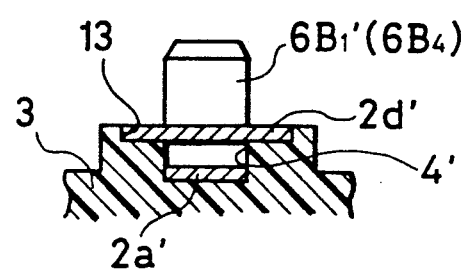

FIGS. 4 and 5 respectively are cross sectional views taken along lines 4—4 and 5—5 of FIG. 1A.

Referring to FIG. 4, the side plates 3 and 3' of the upper and the lower insulating plates 1 and 1' support wide stepped tabs $6B_1$, $6B_2$ and $6B_3$ formed on the bus-bars 2a, 2b and 2c formed on the upper, intermediate and the lower layers. Each of the stepped tabs can be formed from the bus-bar of each layer by shifting the bending position of the first bent portion 9a (see FIG. 3) of the cranked portion 9 by a predetermined pitch (the thickness of the side plate 3 or the like). As an example, the pitches are denoted by symbols $D_1$, $D_2$ and $D_3$. Referring to FIG. 4, reference numeral 2d represents a bus-bar arranged on the upper insulating plate 1 as described later. A projecting edge portion 3a' is formed in the leading portion of the side plate 3' so as to hold and secure the cranked portion of the stepped tab $6B_2$ in cooperation with the end surface of the side plate 3 similarly to the cases shown in FIGS. 2 and 3.

As can be closely seen from a comparison made with FIG. 4, FIG. 5 shows an arrangement where the intermediate bus-bar 2b has no stepped tab, but rather a stepped tab $6B_1'$, the height of which is the same as that of the stepped tab $6B_2$ shown in FIG. 4, is formed on the upper bus-bar 2a. Furthermore, a stepped tab $6B_4$, the height of which is the same as that of the stepped tab $6B_1$ shown in FIG. 4, is formed in the above-described bus-bar 2d which is arranged on the upper insulating plate 1. Referring to FIG. 5, symbols $D_1'$, $D_3$ and $D_4$ represent the bending positions of the cranked portion similarly to the above description.

As can be clearly seen from FIGS. 4 and 5, by changing the position of bending the first bent portion 9a of the cranked portion and by changing its height realized by bending with respect to the bus-bar of each layer of the insulating plates, the stepped tab can be formed on a bus-bar of a desired layer.

FIGS. 6A to 6D respectively are a perspective view, a plan view, a vertical cross sectional side elevational view and a vertical cross sectional front elevational view which illustrate the stepped tabs $6B_1'$ and $6B_4$ shown in FIG. 5.

Referring to FIGS. 6A to 6D, a bus-bar accommodating groove 4' is formed in the upper side plate 3 to accommodate a projecting bus-bar 2a' (the projecting portion of the cranked portion 9) of the stepped tab $6B_1'$. Furthermore, another bus-bar accommodating groove 13 having larger width than the above-described groove 4' is formed in the open space above the groove 4' so as to accommodate a projecting bus-bar 2d' of the stepped tab $6B_4$.

That is, according to this embodiment, the wide and narrow bus-bar accommodating grooves 13 and 4' are arranged vertically with respect to each other in the surface (outer surface) of the uppermost layer or the lowermost layer of the stacked insulating plates (or side edges). Furthermore, a space V capable of providing air insulation is formed between the above-described two bus-bar accommodating grooves 13 and 4'. As a result, the bus-bars 2d' and 2a' are disposed substantially efficiently so as to form two stages.

Figure 7:
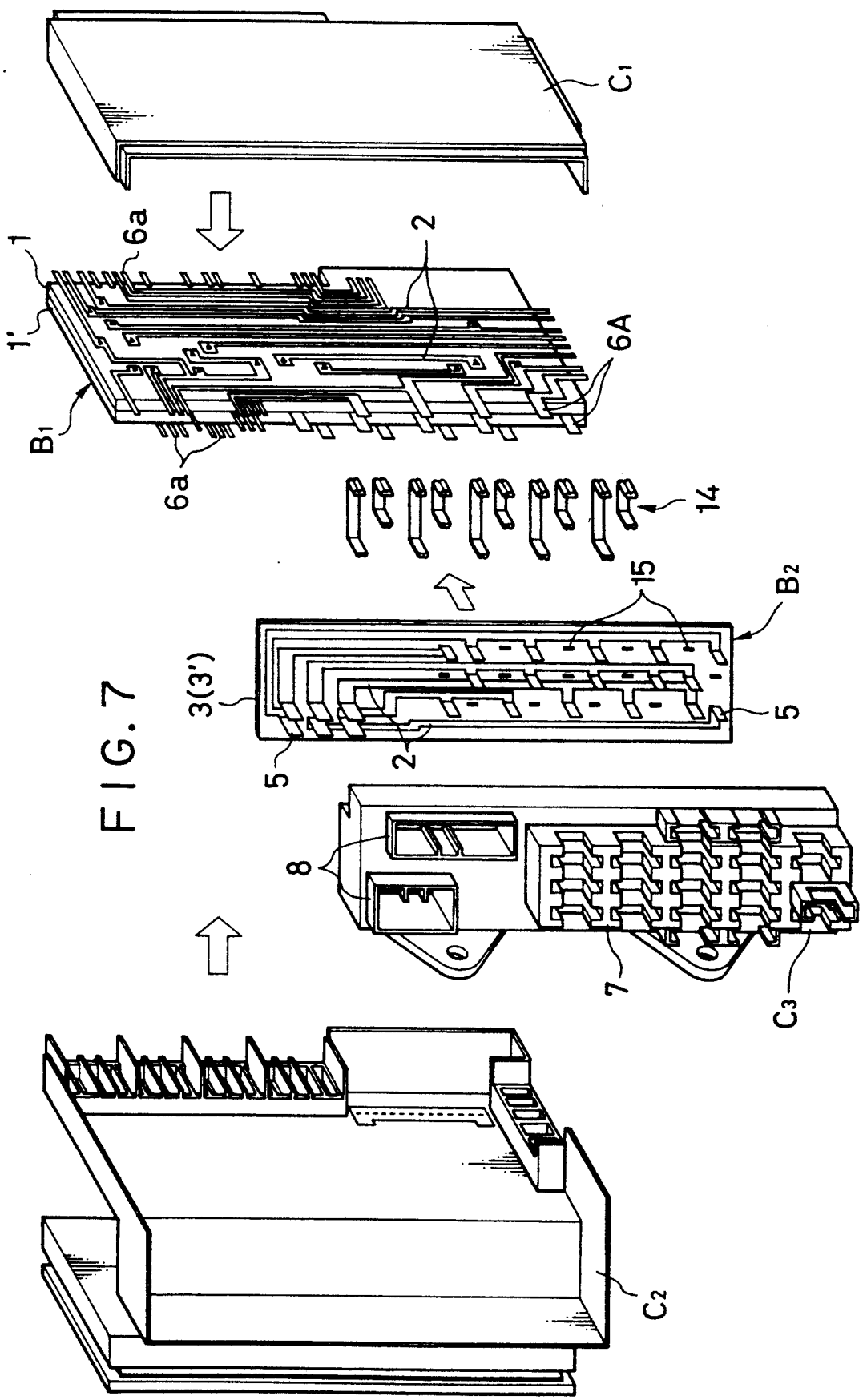
FIG. 7 is an exploded perspective view which illustrates another embodiment of an electrical junction box including a bus-bar circuit board.

FIG. 7 illustrates an embodiment wherein the number of the various stepped tabs 6B, 6b, . . . shown in FIGS. 1 to 6 is reduced or substantially omitted from the structure. As a result, the structure of the assembled bus-bar junction plate is simplified and the yield or number out the bus-bars is improved by reducing the number of the above-described cranked portions 9 of the stepped tabs.

Referring to FIG. 7, bus-bar circuit boards $B_1$ and $B_2$ are structured by separating the insulating plates 1 and 1' from the side plates 3 and 3' of the bus-bar circuit board B shown in FIG. 1. The circuit of each of the circuit boards $B_1$ and $B_2$ is arranged in such a manner that the above-described stepped tabs 6B and 6b are omitted from the structure. The structure, however, includes projecting tabs 5 and a group of the plane bus-bars 2 having the plane tabs 6A or 6a.

A group composed of the projecting tabs 5 is disposed on a plurality of the bus-bars 2. This group forms a major portion of the above-described terminal for a fuse that is fastened to the fuse cavity 7 of the side case $C_3$. The insufficient portion is constituted by the plane tab 6A or the erected tab 5 and a relay terminal 14 of the bus-bar circuit board B1. Furthermore, a terminal insertion hole 15 for fastening the relay terminal 14 is formed in each of the side plates 3 and 3'.

Figure 8A:
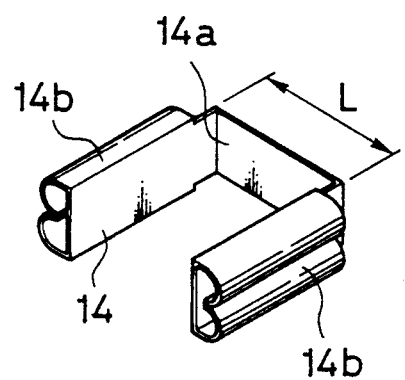
FIGS. 8A to 8D respectively are enlarged views which illustrate relay terminals 14, 14' to 14'" for use in the bus-bar circuit board shown in FIG. 7.
Figure 8B:
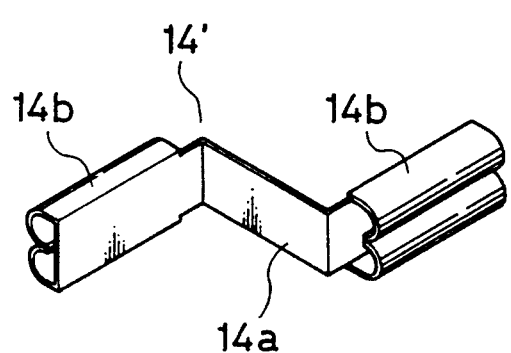

As shown in FIG. 8A in an enlarged manner, the relay terminal 14 is formed into U-shape which is arranged in such a manner that two opposing female terminal portions 14b are formed at the two end portions of a base plate portion 14a. Either of the female terminal portions 14a and 14b is inserted into the plane tab 6A of the bus-bar circuit board B1, while the other female terminal portion is inserted into the terminal insertion hole 15 of the bus-bar circuit board B2.

The above-described relay terminal 14 and the plane tab 6A function in place of the stepped tab 6B shown in FIGS. 1A to 7. Furthermore, by changing length L of the base plate portion 14a, an alignment of the pitch with the terminal insertion holes 15 can be made.

According to this embodiment, the necessity of forming the stepped tabs 6b and 6B on the plane bus-bar 2 can be eliminated. Therefore, a decrease in the yield or number of the bus-bars due to the presence of the above-described cranked portion 9 can be prevented.

Figure 8C:
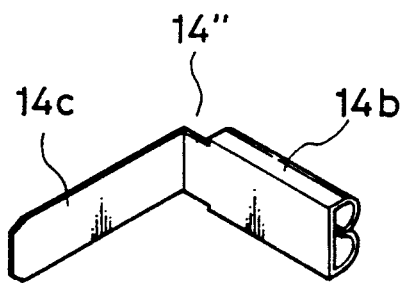
Figure 8D:
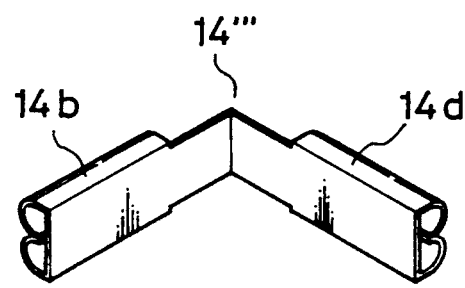
Figure 10:
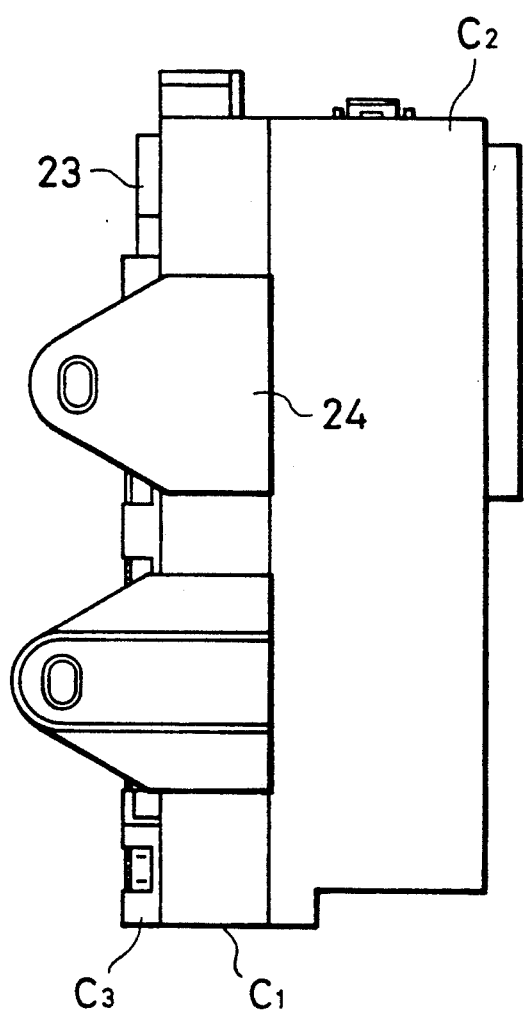
FIG. 10 is a front elevational view which illustrates an assembled state of the electrical junction box shown in FIG. 9.
Figure 11:
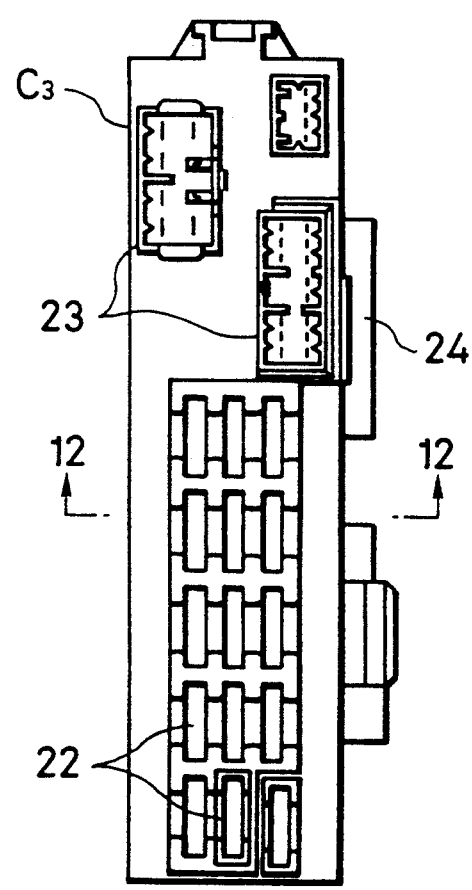
FIG. 11 is a plan view which illustrates the electrical junction box shown in FIG. 10.
Figure 12:
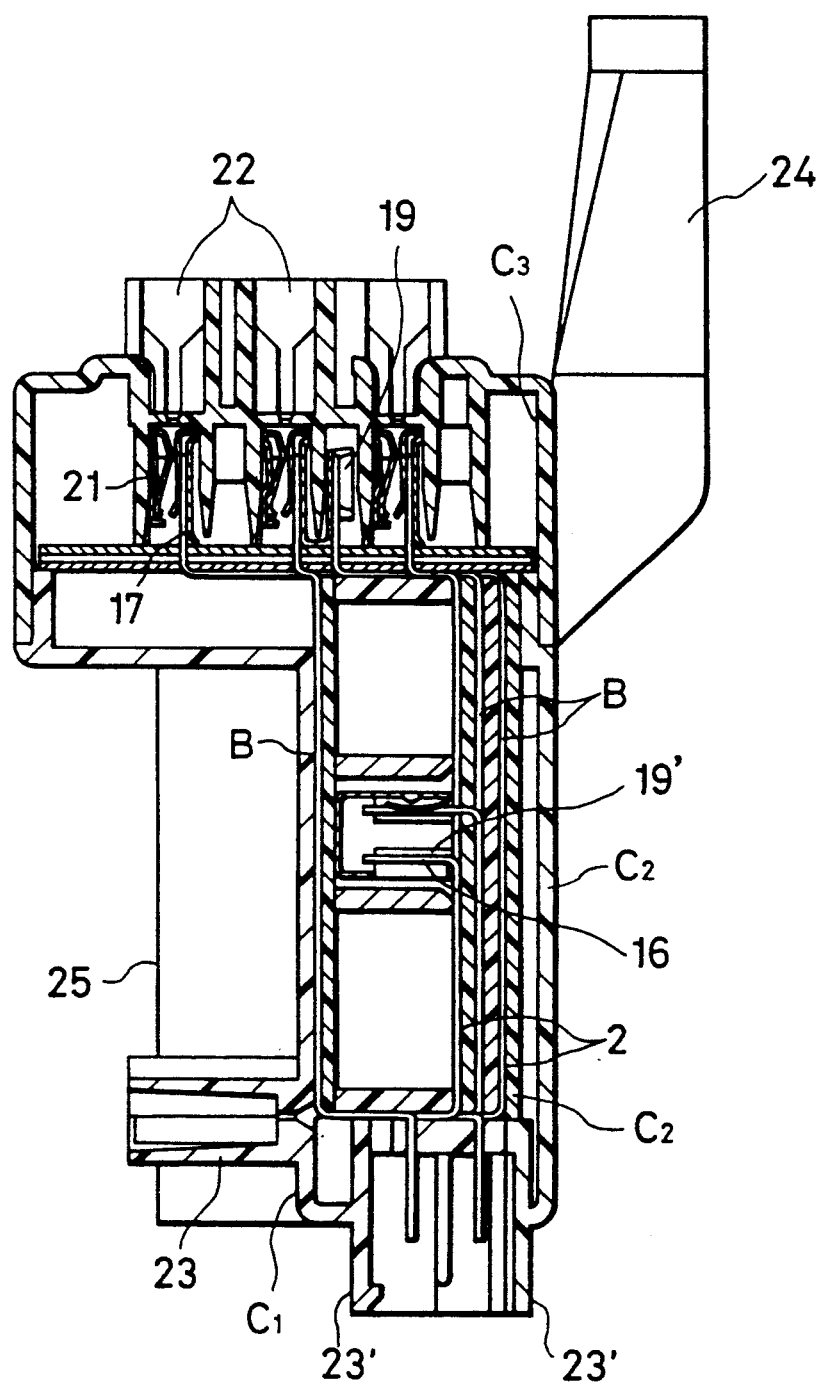
FIG. 12 is a cross sectional view taken along line 12—12 of FIG. 11.

In place of the U-shape relay terminal 14, a crank-like relay terminal 14' may be employed which is arranged in such a manner that the female terminal portions 14b and 14b extend in opposite directions from the two end portions of the base plate portion 14a.

Where the projecting tab 5 arranged as shown in FIG. 1B is formed on the bus-bar circuit board B1, an L-shaped relay terminal 14" shown in FIG. 8C may be employed. The terminal 14" is arranged in such a manner that one end portion is formed into the female terminal portion 14b and the other end portion is formed into a male terminal portion 14c. In another embodiment an L-shaped relay terminal 14''' may be employed which is arranged in such a manner that its two end portions are formed into the female terminal portions 14b.

By combining various relay terminals 14, 14'~14''' shown in FIGS. 8A to 8D with the plane tab 6A (6a) or the erected tab 5, the necessity of directly forming the stepped tab 6B (6b) on the bus-bar 2 can be eliminated.

Therefore, the yield or number of the bus-bars 2 can be improved and as well as the alignment of a predetermined terminal or a connector can easily be achieved at the time of fastening it.

Another embodiment of the present invention will now be described with reference to FIGS. 9 to 14. The side case $C_3$ made of synthetic resin is fastened to the side portions of the upper case $C_1$ and the lower case $C_2$ which are also made of synthetic resin and which are disposed in opposing relation. The side case $C_3$ has a multiplicity of housings, such as fuse cavities 22 for housing fuses, connector connecting portions 23 for housing connectors, and the like so that a structure in which connectors are disposed on the side surfaces thereof is realized. Furthermore, the side case $C_3$ comprises a fastening bracket 24. A wide circuit board retaining seat 12a is formed to project over the surface of an end portion of the upper case $C_1$, that is, a portion adjacent to the side case $C_3$. The circuit board retaining seat 12a has projecting ribs 12b disposed at small pitches and projecting ribs 12b' disposed at small pitches. The above-described ribs 12b and 12b' are formed for the purpose of supporting stepped tabs 17 and 17' to be described later. Furthermore, split type connector-connecting portions 23 are formed in the upper case $C_1$ and the lower case $C_2$ at positions opposing the circuit board retaining seat 12a. Furthermore, the outer surface of the upper case $C_1$ has a fastening frame 25 formed to fasten an electronic unit (omitted from illustration).

In the above-described two cases $C_1$ and $C_2$, a plurality of bus-bar circuit boards $B_1$, $B_2$ to $B_4$ are stacked and accommodated. A bus-bar circuit board B is placed on the circuit board retaining seat 12a in such a manner that the bus-bar circuit B is positioned perpendicular to the above-described circuit board composed of the circuit boards $B_1$, $B_2$ to $B_4$. Each of the bus-bar circuit boards B, $B_1$ to $B_4$ comprises the bus-bar accommodating grooves 4, the insulating plate 1 having the tab insertion hole 15 and a plurality of the bus-bars 2 fitted within the bus-bar accommodating grooves 4. Each of the bus-bars 2 has projecting tabs 16 which serve as terminals for connectors. The above-described structure is arranged to be basically the same as that of the structure of aforementioned embodiments.

Figure 13:
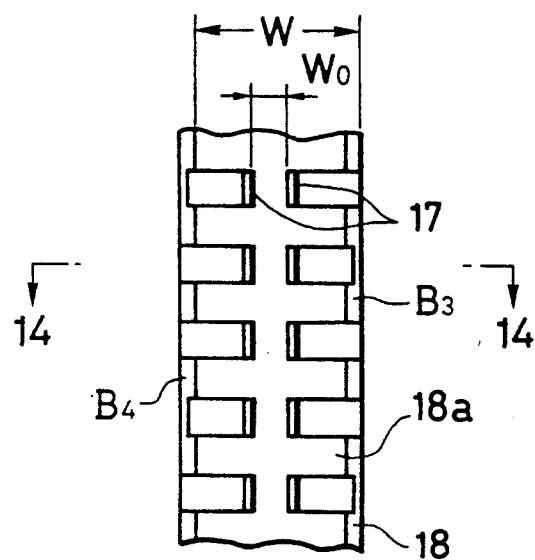
FIG. 13 is a plan view which illustrates the status of the terminal for a connector according to the embodiment shown in FIG. 9.

According to this embodiments, a frame-shape spacer 18 is interposed between the bus-bar circuit boards $B_3$ and $B_4$ which are respectively disposed in the third layer and the fourth layer of the above-described circuit board. Furthermore, wide stepped tabs 17 and narrow stepped tabs 17' are formed on the bus-bars 2 of the bus-bar circuit boards $B_1$ to $B_4$ by means of bending. The stepped tabs 17 and 17' are mainly bent toward the frame-shape spacer 18 with each of their bending portions having a predetermined length as designated by symbols 17a and 17b. The long bent-portion 17a extends and transverses the frame-shape spacer 18 and is supported by the above-described rib 12b or 12b'. On the other hand, the short bent-portion 17b is supported by the frame-shape spacer 18. The frame-shape spacer 18 has a plurality of opening portions 18c formed within surrounding side frames 18a by longitudinal and lateral partition walls 18b. The width of the side frame 18a, that is, the width W of the frame surface is made to be larger than the pitch Wo (a subscript zero) of the confronting stepped tabs 17 (or tabs 17') as shown in FIG. 13. According to this embodiment, reference numeral 20 represents an insulating seat having a tab insertion hole 20a formed therein.

Figure 14:
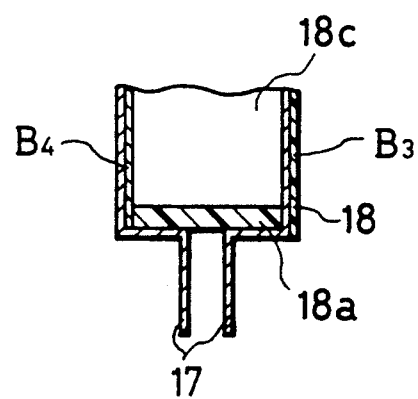
FIG. 14 is a cross sectional view taken along line 14—14 of FIG. 13.

In this structure, bus-bar circuit board $B_1$ and $B_3$ are stacked as in the aforementioned embodiments. In addition, a female-female terminal 19 is connected to the two projecting tabs 16 formed on the different layers or the same layer. The frame-shape spacer 18 is placed over the bus-bar circuit boards $B_1$ to $B_3$ before the bus-bar circuit board $B_4$ is placed on the frame-shape spacer 18c before they are accommodated in a space between the upper case $C_1$ and the lower case $C_2$. Since the frame-shape spacer 18 has a multiplicity of the opening portions 18c therein, the above-described female-female terminals 19 can be accommodated in the opening portions 18c. Furthermore, a plurality of the stepped tabs 17 (and 17') are, as shown in FIGS. 13 and 14, supported by the frame surface 18a of the frame spacer 18. At this time, the stepped tab 17 having the long bent portion 17a extends and transverses the frame surface 18a before it is supported by the rib 12b' adjacent to the upper case $C_1$. Then, the bus-bar circuit board B is placed perpendicular to the stacked bus-bar circuit boards $B_1$ to $B_4$ while interposing the frame-shape spacer 18. Furthermore, the insulating seat 20 is fastened on the bus-bar circuit board B, if necessary. In addition, a female-female terminal 19' or a female-female relay terminal 21 is connected to a group of the tabs 16 projecting through the tab insertion hole 20a. Finally, the side case $C_3$ is fastened so that assembling of an electrical junction box can be completed. Although omitted from illustration, known locking means must be disposed between the upper case $C_1$ and the lower case $C_2$ and between them and the side cases $C_3$.

As can be clearly seen from FIGS. 9, 13 and 14, the stepped tabs 17 and 17' of the bus-bar circuit boards $B_1$ to $B_4$ are supported by the frame surface 18a of the frame-shape spacer 18. Therefore, the necessity of using the side plates 3 and 3' (see FIG. 1) with the insulating plate 1 can be eliminated, thereby simplifying the structure. Furthermore, a complicated design in which the bending positions are changed depending upon the layer can be eliminated. In addition, if the layers must be connected to each other, it can be achieved by utilizing the female-female terminals 19, 19' and the opening portion 18c of the frame-shape spacer 18. Therefore, the circuit of the bus-bar 2 can easily be designed and manufactured.

As described above, according to this embodiment, the electrical junction box has stepped tabs (terminals for connectors that provide a structure whereby connectors can be fastened to the side surfaces thereof. Furthermore, the electrical junction box is arranged in such a manner that the frame-shape spacer with its frame surface which is wider than the pitch of the terminals for the connectors is disposed at a desired layer. Therefore, the stepped terminal for the connector can be supported by utilizing the above-described frame surface. Therefore, both the structure of the insulating plate and the bus-bar can be simplified. Therefore, the assembling facility is improved and, the manufacturing cost can be significantly reduced. In addition, in a case where the bus-bars must be connected to each other in the same layer or the different layers of the circuit board, the connecting terminal can be accommodated by utilizing the opening portion in the frame-shape spacer. Therefore, the pattern for the shape of the bus-bar can further be simplified. Consequently, a desired circuit can easily be designed.

Although the invention has been described in its preferred form width a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. An electrical junction box comprising:
   a case member comprising an upper case, a lower case, and a side case having cavities;
   a circuit board disposed between said upper case and said lower case and comprising a stack of a plurality of bus-bars and insulating plates having grooves provided on surfaces thereof for supporting said bus-bars;
   a plurality of terminals for connectors, each said terminal extending from a corresponding said bus-bar of said circuit board, wherein said terminals including stepped tabs that project from said insulating plates such that each said stepped tab projects substantially parallel to and at a different level with respect to the surface of the insulating plate on which the corresponding bus-bar is supported, and said stepped tabs are disposed at a predetermined pitch in said cavities; and
   means for supporting said stepped tabs.

2. An electrical junction box according to claim 1, wherein each of said stepped tabs is integral with the corresponding bus-bar from which the stepped tab extends and has a cranked portion that is bent at a predetermined position in order to provide said different level, and each said corresponding bus-bar to said stepped tabs is disposed between two of said insulating plates; and
   wherein said means for supporting said stepped tabs comprises a boss projecting over an edge of a first of said two insulating plates and a cut portion provided in an edge of the second of said two insulating plates in opposition to said boss, whereby said cranked portion of said stepped tab is held in position by said case member and one or more of said two insulating plates.

3. An electrical junction box according to claim 1, wherein at least one of said grooves for supporting said bus-bars has formed in an upper periphery portion thereof a wider bus-bar accommodating groove, wherein a first bus-bar is supported in said at least one groove and a second bus-bar is supported in said wider bus-bar accommodating groove, such that said first and second bus-bars are vertically spaced apart from one another.

4. An electrical junction box according to claim 1, wherein said terminals further include plane tabs that extend from said corresponding bus-bars substantially in the same level as the surface of the insulating plate on which the corresponding bus-bar is supported, and said stepped tabs comprise relay terminal members having a cranked portion and, in at least a first end portion thereof, a female terminal portion for connecting to corresponding ones of said plane tabs.

5. An electrical junction box according to claim 4, wherein said circuit board further comprises at least one side plate disposed substantially perpendicularly to at least one of said insulating plates, and wherein said means for supporting said stepped tabs includes tab insertion holes formed in said side plate for receiving a second end portion of each of said relay terminal members.

6. An electrical junction box according to claim 1, wherein said terminals further include projecting tabs that project substantially perpendicularly from said corresponding bus-bars of said circuit board, and said stepped tabs comprise relay terminal members having an L-shaped cross-section and, in at least a first end portion thereof, a female terminal portion for connecting to corresponding ones of said projecting tabs.

7. An electrical junction box according to claim 6, wherein said circuit board further comprises at least one side plate disposed substantially perpendicularly to at least one of said insulating plates, and wherein said means for supporting said stepped tabs includes tab insertion holes formed in said side plate for receiving a second end portion of said relay terminal member.

8. An electrical junction box according to claim 1, wherein said means for supporting said stepped tabs comprises a frame spacer disposed between two of said insulating plates of said circuit board, said spacer having a frame surface across which a portion of said stepped tabs extend and which is wider than the pitch of said stepped tabs.

9. An electrical junction box according to claim 8, wherein said terminals further include projecting tabs that project substantially perpendicularly from said corresponding bus-bars of said circuit board, and said frame spacer has a plurality of openings for receiving a connection portion of said projecting tabs.

10. An electrical junction box comprising:

a case member comprising an upper case, a lower case, and a side case having cavities;

a circuit board disposed between said upper case and said lower case and comprising a stack of a plurality of bus-bars and insulating plates having grooves provided on surfaces thereof for supporting said bus-bars;

a plurality of terminals for connectors, each said terminal extending from a corresponding said bus-bar of said circuit board, wherein said terminals include plane tabs that extend from said corresponding bus-bars substantially in the same level as the surface of the insulating plate on which the corresponding bus-bar is supported, and stepped tabs that project from said insulating plates such that each stepped tab projects substantially parallel to and at a different level with respect to the surface of the insulating plate on which the corresponding bus-bar is supported; and means for supported said terminals;

wherein each said corresponding bus-bar to said stepped tabs is disposed between two of said insulating plates, wherein said each stepped tab has a cranked portion, and wherein said means for supporting said terminals comprises a boss projecting over an edge of a first of said two insulating plates and a cut portion provided in an edge of the second of said two insulating plates in opposition to said boss, whereby said cranked portion of said stepped tab is held in position by said case member and one or more of said insulating plates.

* * * * *